United States Patent
Roy-Neogi et al.

(10) Patent No.: US 6,507,938 B1
(45) Date of Patent: Jan. 14, 2003

(54) METHODS FOR IMPROVING THE PERFORMANCE OF VLSI LAYOUTS DESIGNED BY A TIMING DRIVEN PHYSICAL DESIGN TOOL

(75) Inventors: Kalapi Roy-Neogi, San Jose, CA (US); Nanda Gopal, Monte Sereno, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/439,877

(22) Filed: Nov. 12, 1999

(51) Int. Cl.[7] ............................................. G06F 17/50
(52) U.S. Cl. ............................... 716/10; 716/6; 716/11
(58) Field of Search ................................. 716/7, 10, 11, 716/1, 6, 8–9, 12–13, 17; 713/503

(56) References Cited

U.S. PATENT DOCUMENTS

| | | | | |
|---|---|---|---|---|
| 4,890,238 A | | 12/1989 | Klein et al. | 364/491 |
| 5,359,538 A | | 10/1994 | Hui et al. | 364/491 |
| 5,422,317 A | * | 6/1995 | Hua et al. | 438/129 |
| 5,521,837 A | * | 5/1996 | Frankle et al. | 716/10 |
| 5,659,484 A | * | 8/1997 | Bennett et al. | 716/16 |
| 5,778,216 A | * | 7/1998 | Venkatesh | 713/503 |
| 5,815,406 A | * | 9/1998 | Golla et al. | 716/16 |
| 5,901,063 A | * | 5/1999 | Chang et al. | 703/5 |
| 5,953,236 A | * | 9/1999 | Hossain et al. | 716/11 |
| 6,099,580 A | * | 8/2000 | Boyle et al. | 716/7 |
| 6,117,183 A | * | 9/2000 | Teranishi et al. | 716/11 |
| 6,192,508 B1 | * | 2/2001 | Malik et al. | 716/10 |
| 6,230,304 B1 | * | 5/2001 | Groeneveld et al. | 716/7 |
| 6,233,724 B1 | * | 5/2001 | LaBerge | 716/18 |
| 6,286,128 B1 | * | 9/2001 | Pileggi et al. | 716/10 |

OTHER PUBLICATIONS

Doll, K., et al., "Iterative Placement Improvement by Network Flow Methods", *IEEE Transactions on Computer–Aided Design of Integrated Circuits and Systems*, vol. 13, 1189–1199, (Oct. 1994).

(List continued on next page.)

*Primary Examiner*—Vuthe Siek
*Assistant Examiner*—Paul Dinh
(74) *Attorney, Agent, or Firm*—Schwegman, Lundberg, Woessner & Kluth PA

(57) ABSTRACT

Methods for improving the performance of VLSI layouts designed by a timing driven physical design tool. According to one embodiment of the present invention cells of a circuit design are placed in a placement of an integrated circuit, and wires are routed between the cells to complete a layout of the integrated circuit having a number of nets. The placement is analyzed for timing performance, and an improved location is identified for each cell in the placement. The improved location is identified based on an estimated savings in delays caused by all of the nets in the layout to a signal propagating through the layout when the cell is placed in the improved location and a net criticality of each net in the layout.

17 Claims, 14 Drawing Sheets

OTHER PUBLICATIONS

Doll, K., et al., "Placement Improvement by Network Flow Methods", *Institute of Electronic Design Automation, Department of Electrical Engineering*, 179–188.

Eisenmann, H., et al., "Generic Global Placement and Floorplanning", *35th Design Automation Conference, Institute of Electronic Design Automation*, 6 pages, (1998).

Kleinhans, J.M., et al., "GORDIAN: VLSI Placement by Quadratic Programming and Slicing Optimization", *IEEE Transaction on Computer–Aided Design*, vol. 10, 356–365, (Mar. 1991).

Kleinhans, J.M., et al., "GORDIAN: A New Global Optimization/REctangle Dissection Method for Cell Placement", *Institute of Computer–aided Design, Department of Electrical Engineering*, Technical University of Munich, D–8000Munich 2, West Germany, 506–509, (1988).

Pillage, L.T., et al., "Asymptotic Waveform Evaluation for Timing Analysis", *IEEE Transactions on Computer–Aided Design*, vol. 9, 352–366, (Apr. 1990).

Ratzlaff, C.L., et al., "RICE: Rapid Interconnect Circuit Evaluator", *28th ACM/IEEE Design Automation Conference*, Paper 33.1, 6 pages.

Sherwani, N., "Algorithms for VLSI Physical Design Automation", *Kluwer Academic Publishers*, p. 8, (1995).

* cited by examiner 1030 1032 1034

1030 1032 1034 1030 1034

1032

1030

1034

1030,1032 1030 1034

1032 1030 1034

METHODS FOR IMPROVING THE PERFORMANCE OF VLSI LAYOUTS DESIGNED BY A TIMING DRIVEN PHYSICAL DESIGN TOOL

FIELD OF THE INVENTION

The present invention relates generally to design methods for VLSI layouts, and more particularly to methods for improving the performance of VLSI layouts designed by a timing driven physical design tool.

BACKGROUND

Integrated circuits comprise a collection of components such as transistors, resistors, and capacitors, fabricated on a semiconductor substrate and connected together with metal interconnections, called wires, to form a system such as a microprocessor. Integrated circuit performance has been improving because the components and the wires are being fabricated in smaller sizes to increase the density of the integrated circuits. More and more components and wires are being placed on to each unit area of semiconductor substrate. Parasitic effects in the wires, such as capacitance and resistance, have a more substantial influence on performance as the wires become smaller and are placed closer together. The parasitic effects influence the operating speed and timing of an integrated circuit.

Integrated circuits are classified according to their levels of complexity. Very large-scale integration (VLSI) circuits are the most complex. A VLSI circuit may include an arrangement of gates, also called cells, each of which implements a logic function. Cells may be standardized and selected from a cell library. Examples of cells include an exclusive-OR gate, an AND-OR-INVERT gate, flip-flops, adders, and a read-only memory (ROM). The arrangement of cells is fabricated on a semiconductor substrate and the cells are connected together with wires to complete the integrated circuit.

The performance of the VLSI circuit may substantially depend on its design, and it is designed in a design process. A flowchart of a conventional design process 100 for a VLSI circuit is shown in FIG. 1. A system specification is provided in 110, and in 112 a functional design is developed to carry out the system specification. The functional design is translated into a logic design in 114 and the logic design is verified in 116 in an iterative manner. A circuit design is then constructed based on the logic design with a selection of cells in 118, and the circuit design is verified in 120 in an iterative manner. An early physical design of the VLSI circuit is generated in 122 concurrently with the design and verification procedures 112–120, and the physical design is completed in 124 based on the early physical design and the circuit design. The physical design of the VLSI circuit is a design of the cells and wires that are fabricated in a semiconductor substrate, and includes a placement of the cells and a routing of wires between the cells. The placement of the cells and the routing of the wires comprise a layout of the VLSI circuit, and the layout is verified with reference to the circuit design in 126 in an iterative manner. The VLSI circuit is then fabricated in 128 and packaged and tested in 130.

Physical design tools are software packages used to generate the physical design. Several different types of physical design tools are known to those skilled in the art including floorplanning tools, partitioning tools, placement tools, and routing tools. Placement tools are used to locate the cells in the layout while routing tools are used to route the wires between the cells.

Two primary goals of conventional placement tools are to reduce the area of a semiconductor substrate occupied by an integrated circuit by improving its density, and to improve the timing performance of the integrated circuit. The placement tools reduce a total wire length of a layout to improve its density. In addition a timing-driven placement tool also rearranges the placement of cells to improve timing performance.

As parasitic effects become more significant in limiting the performance of VLSI circuits, placement tools are being used to improve the timing performance of integrated circuits. Conventional placement tools use approximations that may compromise the performance of resulting integrated circuits. For example, conventional placement tools use simplified delay models such as Elmore or lumped RC approximations for wires in a net and estimate the lengths of the wires to compute a delay of the net.

There is a need for a placement tool that creates VLSI circuit layouts with substantially improved timing performance.

SUMMARY OF THE INVENTION

According to one embodiment of the present invention a method includes placing cells of a circuit design in a placement of an integrated circuit, routing wires between the cells to complete a layout of the integrated circuit having a number of nets, and analyzing the placement for timing performance. The method also includes, for each cell in the placement, identifying an improved location for the cell based on an estimated savings in delays caused by all of the nets in the layout to a signal propagating through the layout when the cell is placed in the improved location and a net criticality of each net in the layout.

DETAILED DESCRIPTION

In the following detailed description of exemplary embodiments of the present invention, reference is made to the accompanying drawings which form a part hereof, and in which are shown by way of illustration specific exemplary embodiments in which the present invention may be practiced. These embodiments are described in sufficient detail to enable those skilled in the art to practice the present invention, and it is to be understood that other embodiments may be utilized and that logical, mechanical, electrical and other changes may be made without departing from the spirit or scope of the present invention. The following detailed description is, therefore, not to be taken in a limiting sense, and the scope of the present invention is defined only by the claims.

Figure 1:
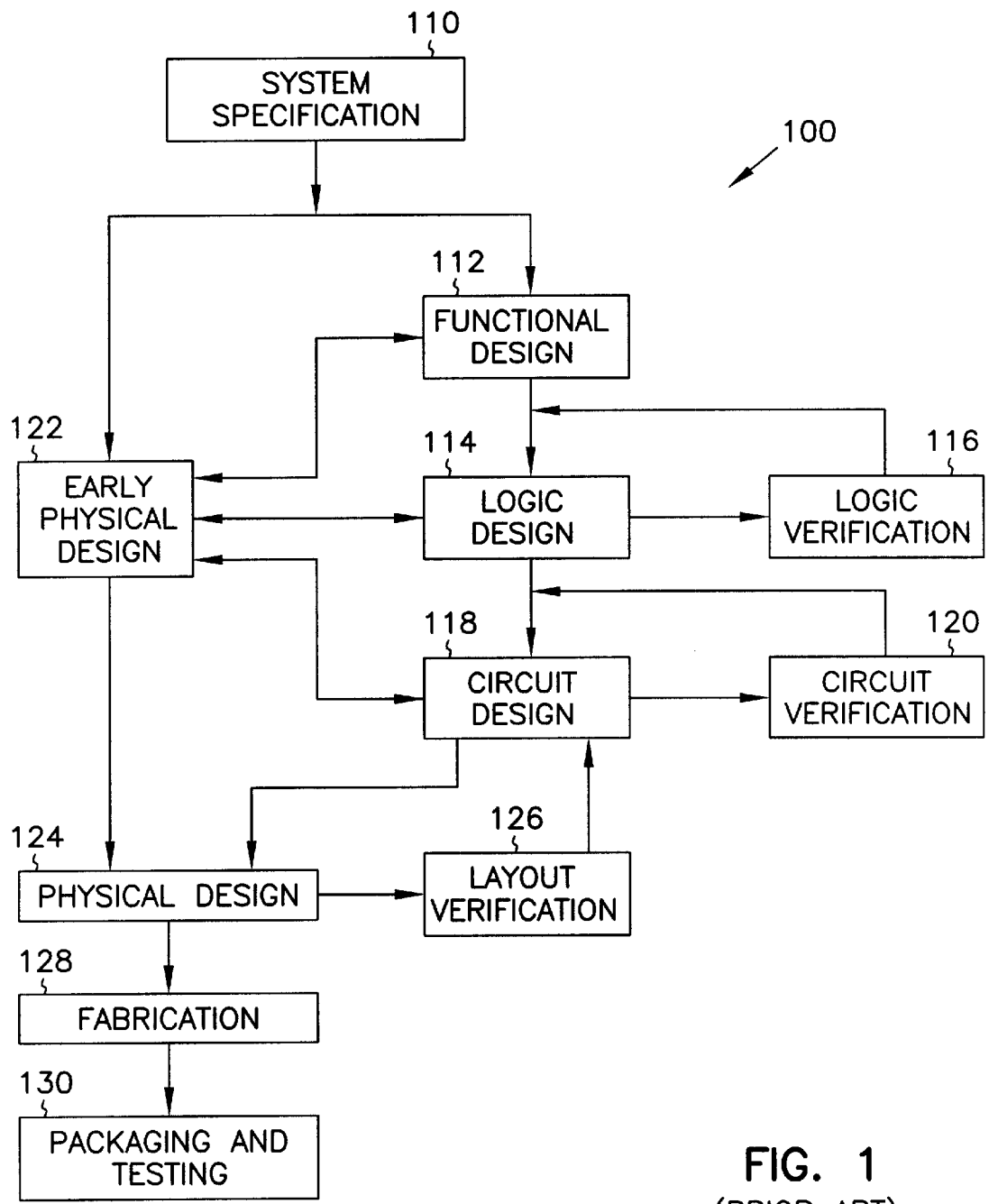
FIG. 1 is a flowchart of a design process for a VLSI circuit according to the prior art.
Figure 2:
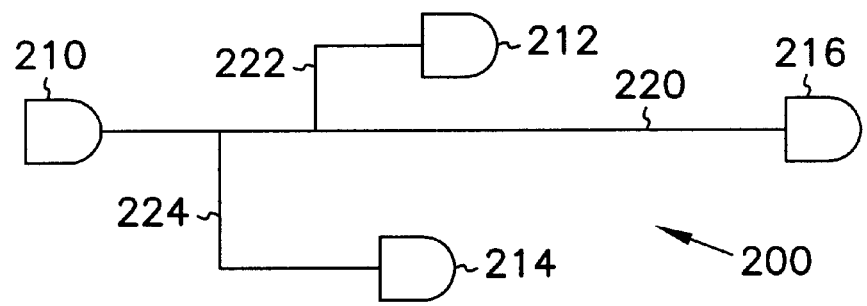
FIG. 2 is a block diagram of a net according to an embodiment of the present invention.

In this description a layout is described as including a placement of cells and a routing of wires between the cells. Each cell is connected to one or more other cells by a wire or a net of wires. A block diagram of a net 200 according to an embodiment of the present invention is shown in FIG. 2. Four cells 210, 212, 214, 216 are connected together by three wires 220, 222, 224. The wires 220, 222, 224 in the net are electrically connected together such that a single signal may propagate along the net from one of the cells 210, 212, 214, 216 to another.

Figure 3:
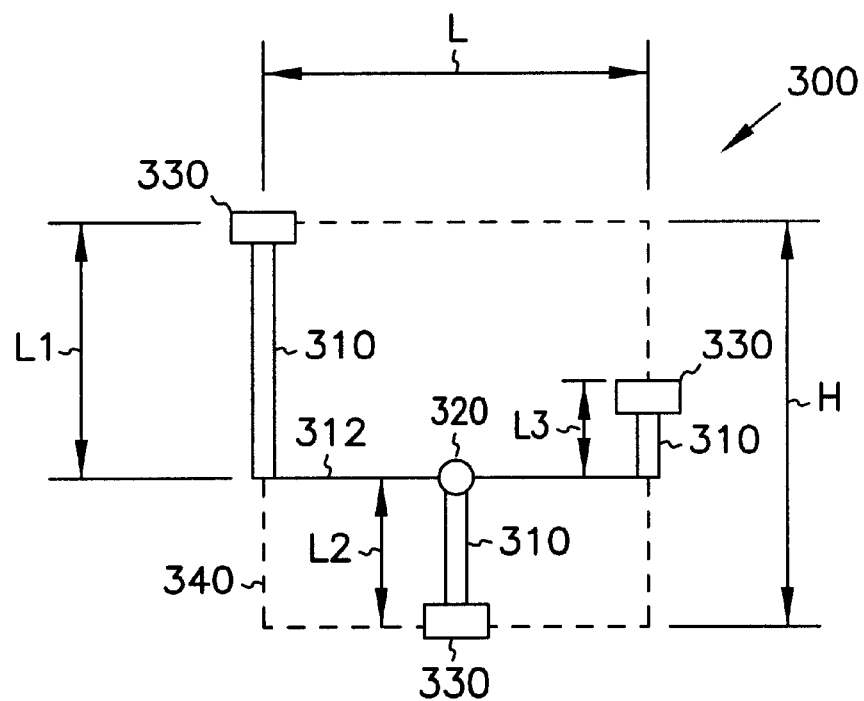
FIG. 3 is an electrical schematic diagram of a net according to an embodiment of the present invention.

An electrical schematic diagram of a routed net 300 created by a routing tool according to an embodiment of the present invention is shown in FIG. 3. The routed net 300 includes two different types of metal wires 310, 312, a via 320, and three pins 330, each of which is a connection point between the routed net 300 and a cell.

The timing performance of a layout depends in part on the length of wires, also called wire length, in the nets in the layout. The half perimeter box method is one way of estimating a wire length of the routed net 300. A bounding box 340 is defined along borders of the routed net 300 and the length of the routed net 300 is estimated to be one-half of the perimeter of the box 340. In this example the length of the routed net 300 is actually L+L1+L2+L3. Using the half perimeter box method the length is estimated to be L+H where H=L1+L2. Thus the half perimeter box method would produce a result which is in error by L3.

A routing tool that routes the wires may generate a more accurate wire length for a net. In addition to generating accurate data about the wires in a layout, the routing tool may include the dimensions of vias and the dimensions of wires that traverse several levels of the layout.

Figure 4:
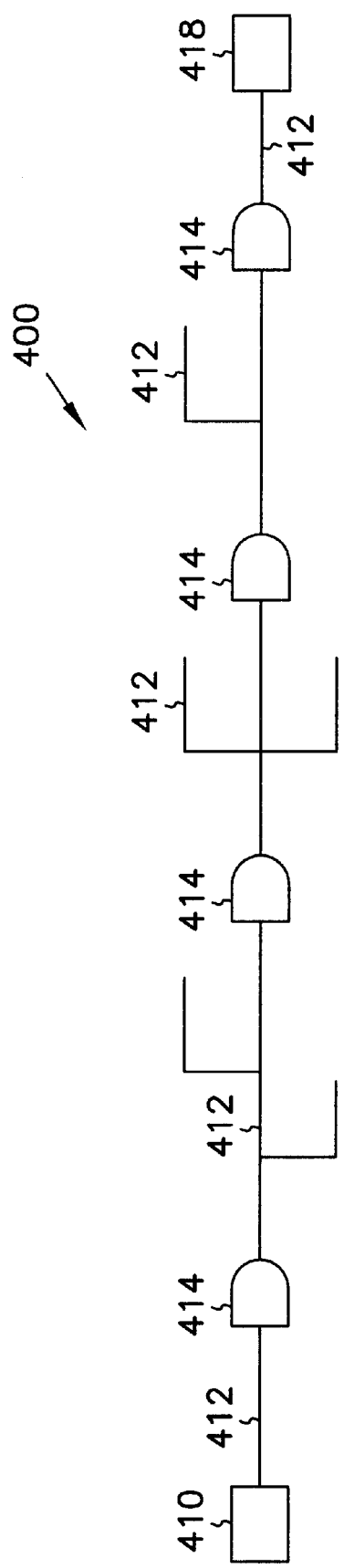
FIG. 4 is a block diagram of a signal path according to an embodiment of the present invention.

In this description a signal path is a sequential ordering of one or more nets and cells occurring alternately through which a signal propagates from a driver cell to a receiver cell. A block diagram of a signal path 400 is shown in FIG. 4. The signal path 400 includes a driver cell 410, several nets 412 and intermediate cells 414, and a receiver cell 418. A signal path response for the signal path 400 is the time it takes for an input signal received by the driver cell 410 to be operated upon by the cells 410, 414 in the signal path 400 and for a resulting output signal to reach the receiver cell 418. Each cell and each wire in the signal path causes a delay in the propagation of the signals through the signal path, and the signal path response is the accumulation of the delays. Some of the signal paths in a layout may be designed within a timing constraint, and these signal paths are identified as critical signal paths. The signal path response for a critical signal path must be within the timing constraint. In other words, an input signal received by the driver cell 410 must be converted into an output signal that reaches the receiver cell 418 within the timing constraint. Each signal path in a layout may comprise several nets, and each net may be part of several signal paths.

Embodiments of the invention will be described in the context of a timing-driven placement tool that places cells in a layout of an integrated circuit. The placement tool places cells using an algorithm that reduces an objective cost function including a density factor that represents the density of the integrated circuit and a timing factor representing the timing performance of the integrated circuit. The timing factor is based on measurable delays of the nets in the layout. Two different modes of the placement tool are available to construct the cost function: a net-weight mode and a signal path-based mode. In the net-weight mode the nets on critical signal paths are assigned relative weights that are proportional to properties of the nets such as wire length or net delay. However, timing is not a direct function of wire length. Further, the net delay property is calculated based on each net in isolation and ignores the effect of all the signal paths the net belongs to in the layout.

Embodiments of the present invention will be described in the context of a timing-driven placement tool that employs the signal path-based mode to construct a cost function. In the signal path-based mode, a slack of a net is calculated based on a slack of a critical signal path in which the net resides. The slack of a net or a critical signal path is the difference between an actual delay of the net or critical signal path and its timing constraint. The actual delay of a critical signal path is the accumulated delays of the nets and the cells in the critical signal path. In particular, embodiments of the present invention will be described in the context of an existing placement tool disclosed in Konrad Doll et al., *Iterative Placement Improvement by Network Flow Methods*, 13 IEEE Transactions on Computer-Aided Design of Integrated Circuits and Systems 1189 (1994). Those skilled in the art with the benefit of the present description will understand that embodiments of the invention may be practiced using other types of physical design tools and in floorplanning tools, partitioning tools, and routing tools.

Embodiments of the present invention will be described with reference to variables representing mathematical quantities that are shown in italics (e.g. Current Effective Net Delay).

Conventional placement tools do not include a sophisticated timing analysis of a layout because such a timing analysis consumes considerable computational resources and requires a design that tightly integrates timing analysis tools. Conventional placement tools rely on rough estimates to calculate the effects of the placement on timing, but this is becoming an inadequate approach because of the increased significance of parasitic effects. Embodiments of the invention described below include a timing analysis and other features which substantially improve the timing performance of layouts.

Figure 5:
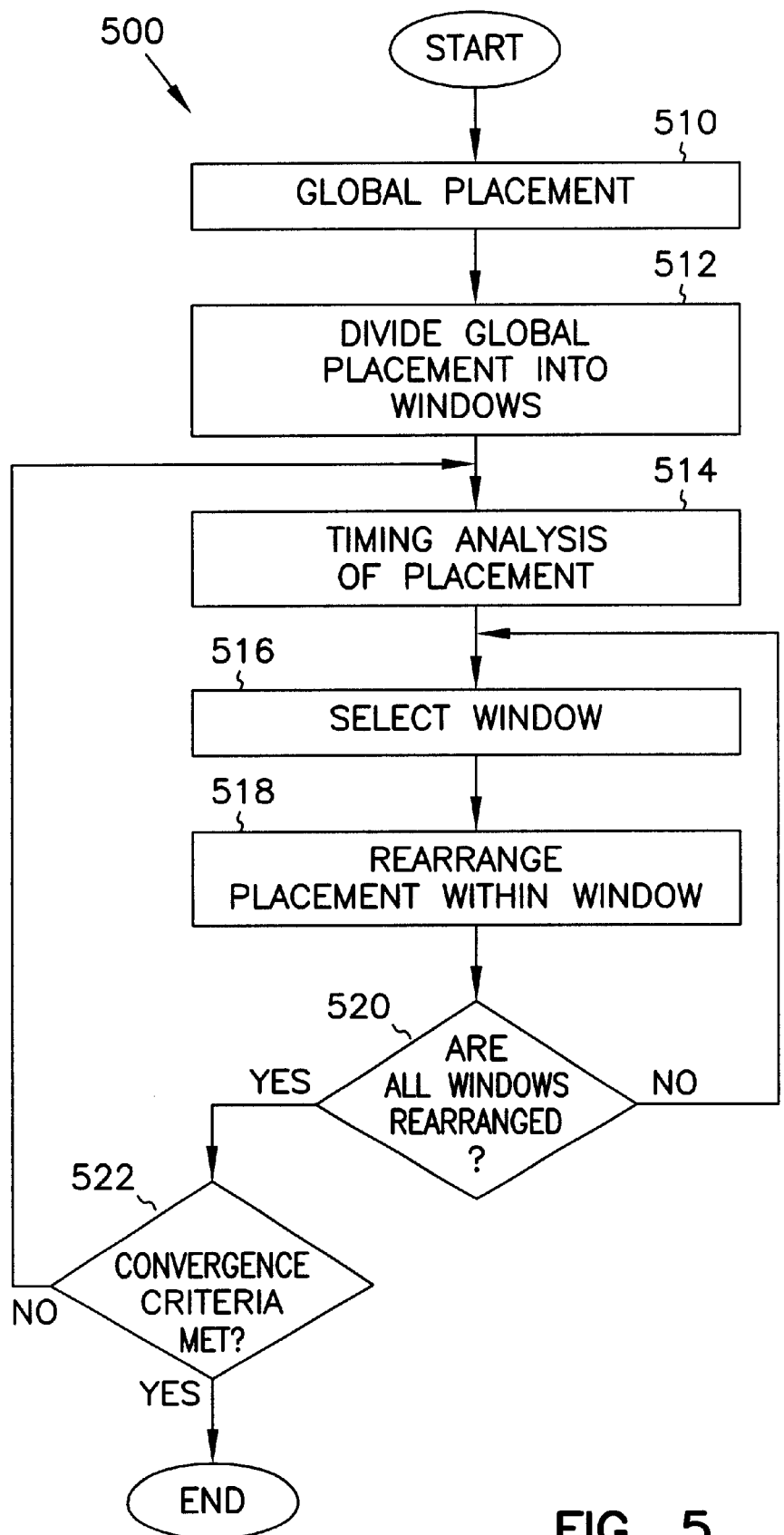
FIG. 5 is a flowchart of a timing-driven placement method according to an embodiment of the present invention.

A flowchart of a timing-driven placement method 500 used by a timing-driven placement tool according to an embodiment of the present invention is shown in FIG. 5. The placement method 500 receives a circuit design developed from a system specification as an input, the circuit design including a selection of cells and a set of interconnections between the cells. The placement method 500 also receives as an input a set of timing constraints defined in terms of delay boundaries for critical signal paths in the circuit design.

The placement method 500 begins with a global placement of the cells in 510. The global placement is carried out with an algorithm disclosed in Jurgen M. Kleinhans et al., *GORDIAN. VLSI Placement by Quadratic Programming*

*and Slicing Optimization*, 10 IEEE Transactions on Computer-Aided Design of Integrated Circuits & Systems 356 (1991). The global placement is a rough placement of the cells which may be improved in the placement method 500. In 512, the result of the global placement is divided into a set of subregions called windows, and in 514 a timing analysis of the entire placement, over all of the windows, is carried out to determine its performance. The timing analysis will be described in more detail with reference to FIG. 6. In 516 a window is selected from the windows created in 512, and the placement within the window is rearranged in 518. The rearrangement carried out in 518 is described in more detail with reference to FIG. 8. In 520 it is determined whether the placements in all of the windows have been rearranged, and if this is not the case the placement method 500 returns to 516 to select another window for which the placement is rearranged in 518. If the placements in all of the windows have been rearranged a convergence criteria is evaluated in 522 to determine whether to continue rearranging the placement. The convergence criteria is met if the timing analysis of 514 indicates that the performance of the placement has improved insubstantially from an immediately prior iteration of the placement method 500, and the placement method 500 ends. If the improvement in performance is substantial according to the convergence criteria, the placement method 500 returns to 514 to carry out another timing analysis of the entire placement and to continue rearranging the placement.

Figure 6:
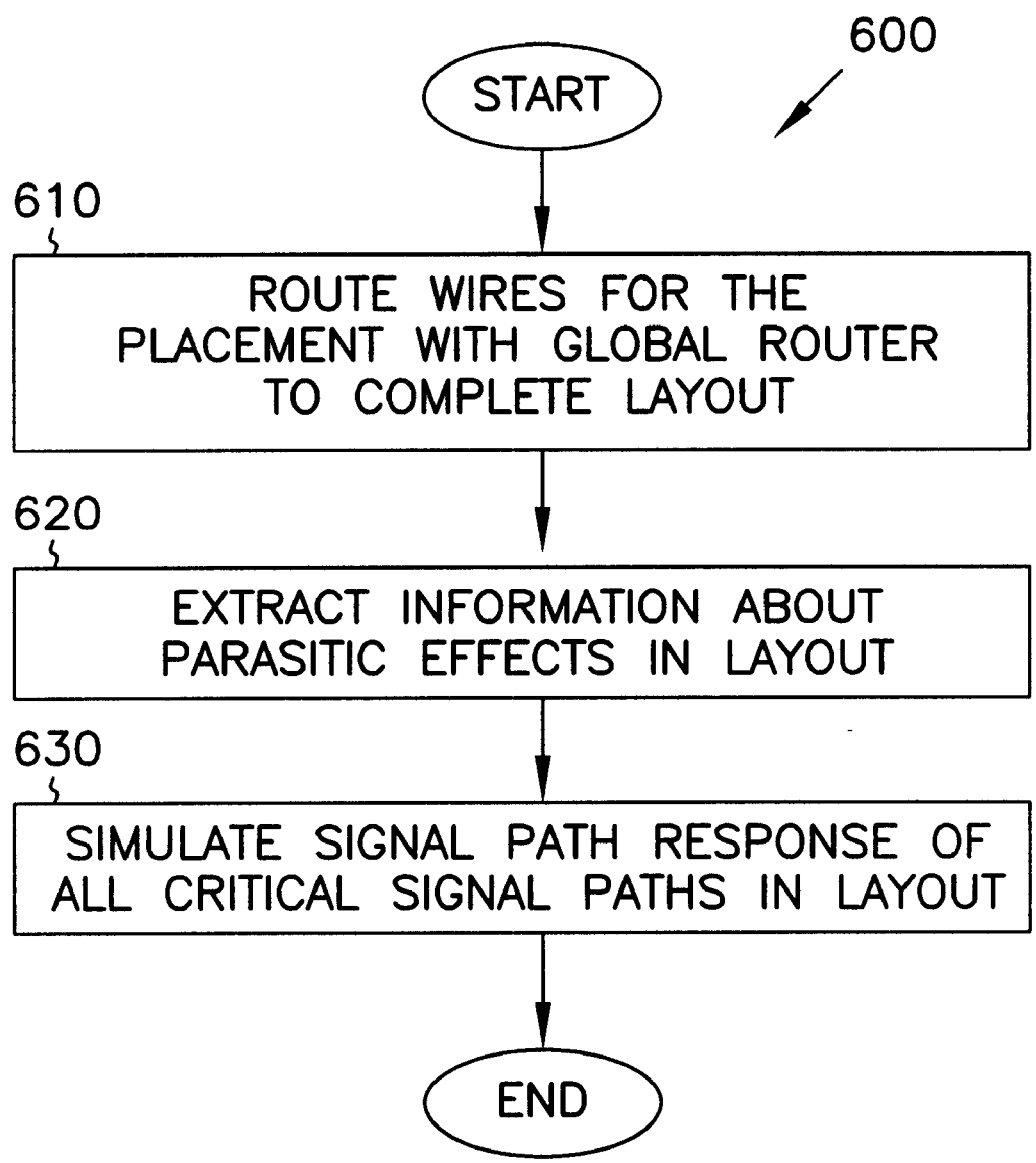
FIG. 6 is a flowchart of a method for carrying out a timing analysis according to an embodiment of the present invention.

A flowchart of a method 600 for carrying out the timing analysis in 514 according to an embodiment of the present invention is shown in FIG. 6. In 610 wires are routed for the placement of the cells with a global router which provides a model for the wires to complete a layout. The model includes detailed information about actual wire length, location and size of vias, the size of pins in each cell to which the wires are connected, and information about the wires across several levels of the layout. The global router provides much better information about the wires than the half perimeter box method described above, and the detailed information about the wires improves the accuracy of the timing analysis in 514. Global routers are physical design tools known to those skilled in the art. In 620 information about parasitic effects in the layout is extracted from the model of the wires generated by the global router. In 630 a signal path response is simulated for all critical signal paths in the layout to generate timing information.

The simulation of a signal path response for a signal path in a layout, such as the simulation in 630, is carried out with a net by net calculation of the progression of signals through a signal path. As an example, the simulation is described with reference to the net 200 shown in FIG. 2 which represents a net in a signal path. An input signal is received by the cell 210, called a driver cell 210, at an input (not shown) connected to a preceding net or an input of an integrated circuit including the signal path. The driver cell 210 then operates on the input signal and produces an output signal. The driver cell 210 drives the output signal on to the wires 220, 222, 224. The output signal is received by one of the cells 212, 214, 216, called receiver cells, to be converted and relayed to one or more succeeding nets, or to an output of the integrated circuit. The simulation continues by calculating the progress of signals through each succeeding net in the signal path until the entire signal path response is simulated.

In the simulation of a signal path response described above the input and output signals are each defined by several parameters including a slope and a delay. The slope for a signal in transition between an initial value and a final value is defined as the time it takes the signal to progress from 20 percent to 80 percent of its final value. The delay of the signal in transition is defined as the difference between the 50% points of the input and output waveforms.

Flowcharts of a method 700 for simulating the signal path response in 630 for all critical signal paths in the layout are shown in FIGS. 7A–7D according to an embodiment of the present invention. In 710, shown in FIG. 7A, timing constraints for each critical signal path in the layout are input and in 712 various capacitance values are generated for each net in the layout based on the model produced by the global router in 610 of FIG. 6. Using the net 200 as an example, a capacitance $C_{wire}$ of all the wires 220, 222, 224 in the net 200 and a capacitance $C_{pin}$ of all the pins of the receiver cells 212, 214, 216 in the net 200 are summed to calculate a total load capacitance $C_{total}$ of the net 200:

$$C_{total} = C_{wire} + C_{pin} \qquad (1)$$

The driver cell 210 is also evaluated to determine a maximum capacitance $C_{max}$ that it can drive and a load ratio for the net 200 is calculated as $C_{total}/C_{max}$.

Figure 7A:
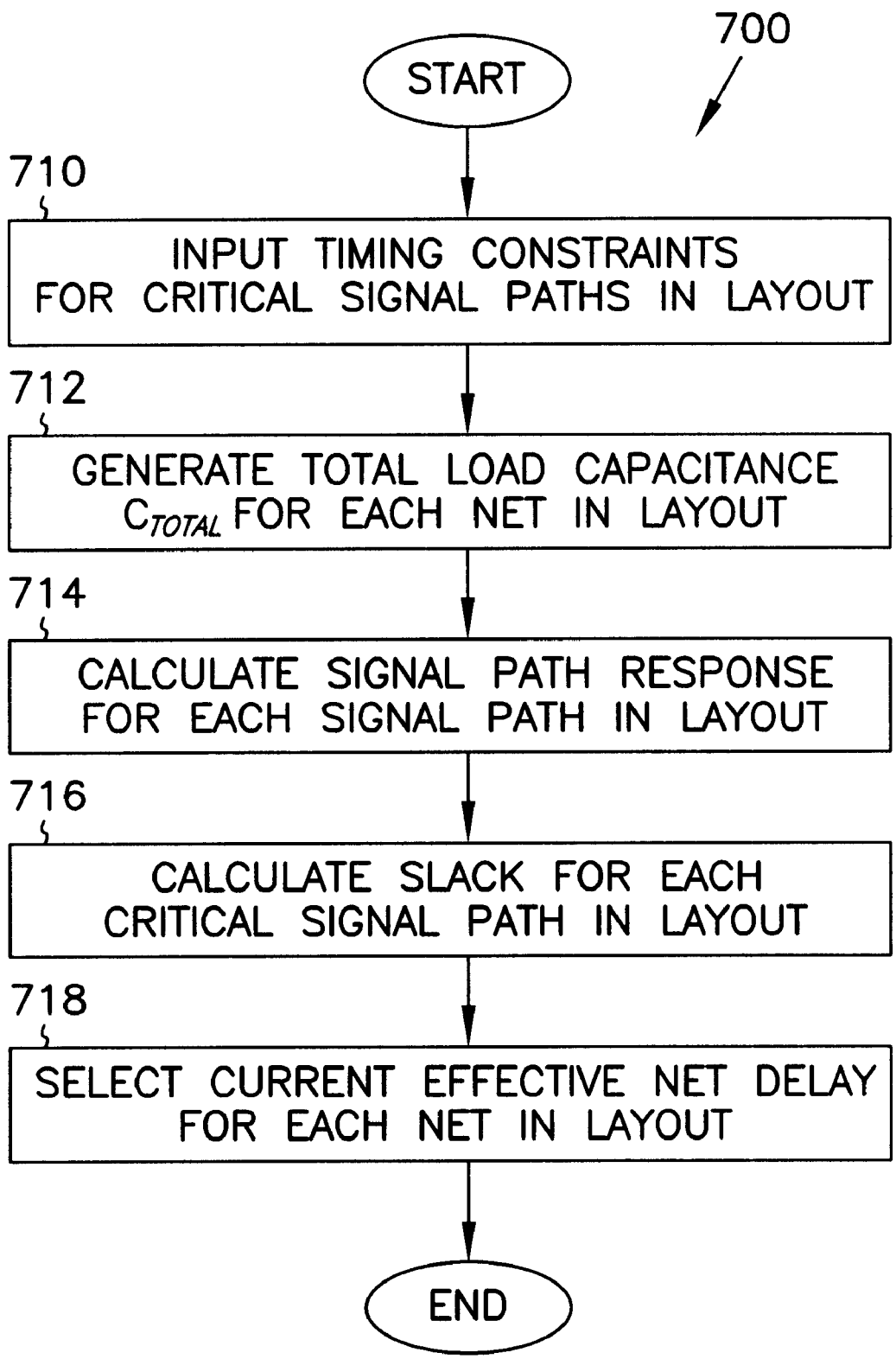
FIGS. 7A–7D are flowcharts of a method for simulating a signal path response for all critical signal paths in a layout according to an embodiment of the present invention.
Figure 7B:
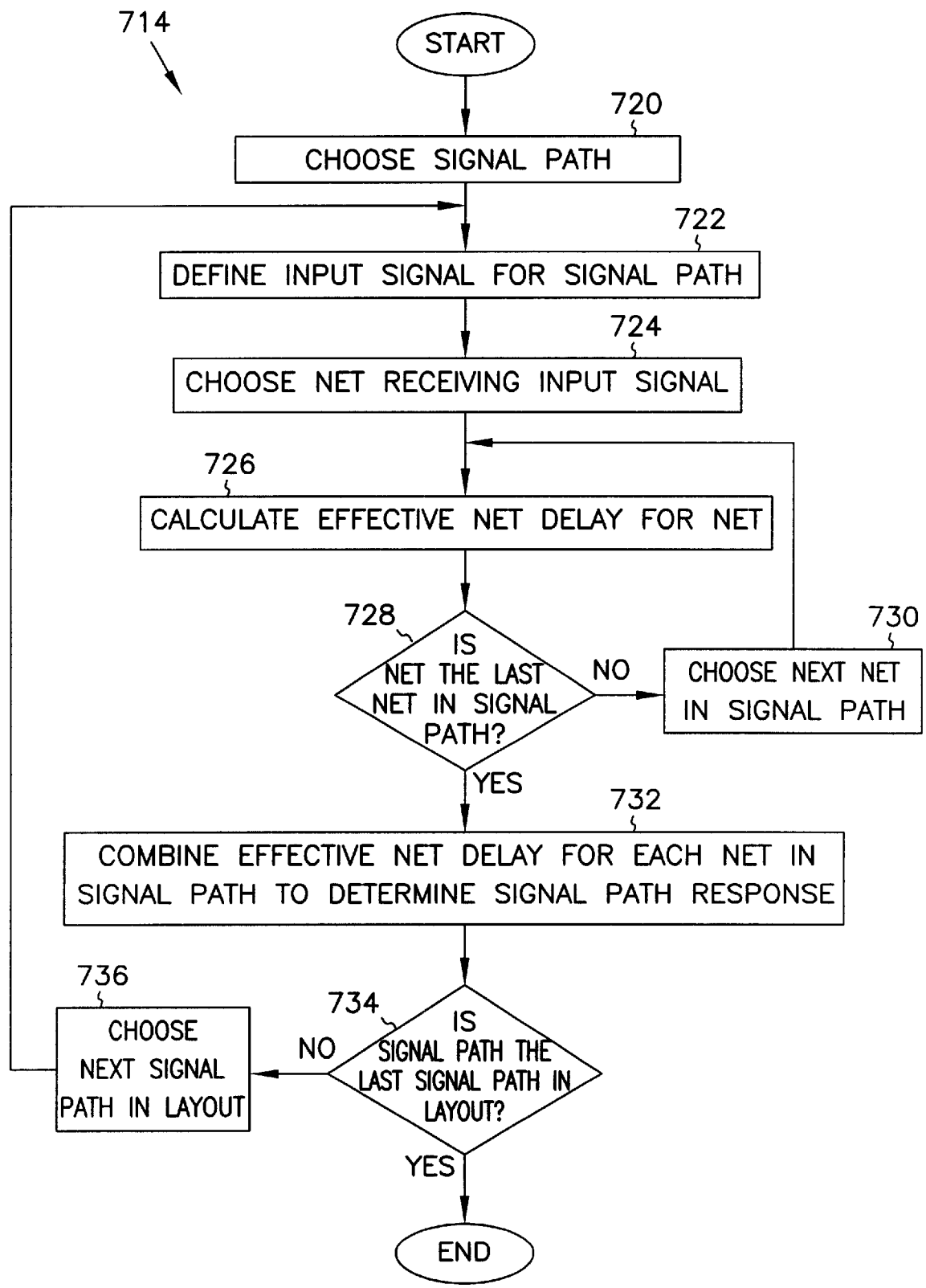

A signal path response is calculated for each signal path in the layout in 714, as will be described in more detail with reference to FIG. 7B. The slack is calculated for each critical signal path in the layout in 716. As described above, the slack of a critical signal path is the difference between an actual delay of the critical signal path and its timing constraint. The slack of a critical signal path is positive if the actual delay is less than the timing constraint, and the slack is negative if the actual delay is longer than the timing constraint. The sign of the slack may be reversed in alternate embodiments of the present invention. A delay caused by each net in the layout, called Current Effective Net Delay, is then selected in 718. The Effective Net Delay caused by a net refers to a delay in the propagation of a signal on a signal path as the signal propagates through the net and its associated driver cell. The word Current is used to indicate that the Effective Net Delay is calculated for the net in the current layout. The selection of the Current Effective Net Delay will be described in more detail with reference to FIG. 7D.

The calculation of the signal path response in 714 for each signal path in the layout is now described in more detail with reference to FIG. 7B. In 720, a signal path is chosen in the layout and an input signal is defined for the signal path in 722. Properties of the input signal include a slope and a delay as defined above. A net receiving the input signal is chosen in 724 and an Effective Net Delay for the net is calculated in 726. The calculation of the Effective Net Delay in 726 will be described in more detail with reference to FIG. 7C. In 728 it is determined whether the net is the last net in the signal path and, if not, the next net in the signal path is chosen in 730 and an Effective Net Delay for the next net is calculated in 726. In 732 the Effective Net Delays calculated for each net in the signal path are combined to determine the signal path response of the chosen signal path. In 734 it is determined whether the chosen signal path is the last signal path in the layout, and if so the calculation of the signal path response 714 terminates. If there are additional signal paths for which a response is to be calculated, the next signal path in the layout is chosen in 736 and the response of the signal path to an input signal is calculated in 722–732.

Figure 7C:
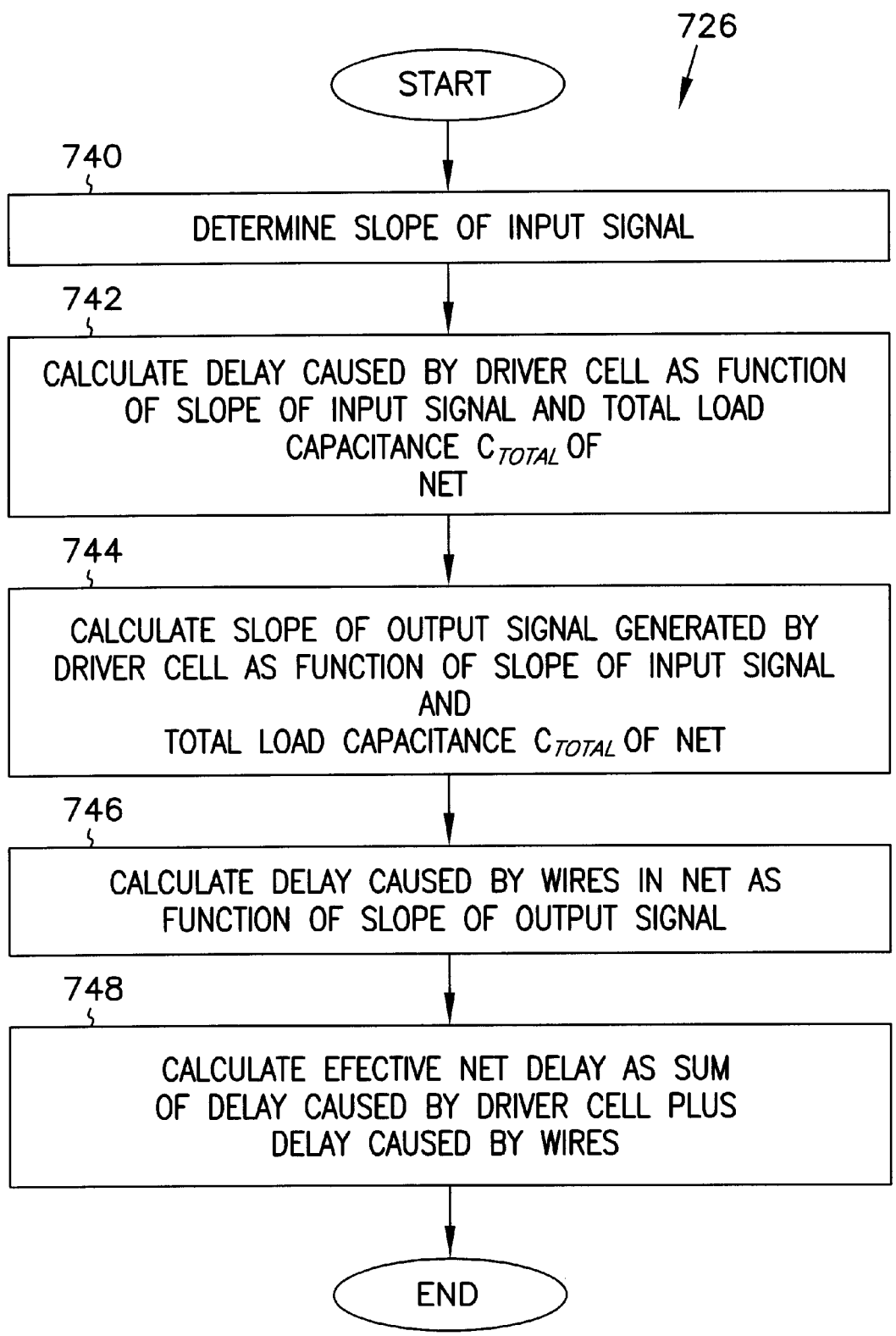

The calculation of the Effective Net Delay for the net in 726 is now described in more detail with reference to FIG. 7C, and with reference to the net 200 shown in FIG. 2. A slope of the input signal received by the driver cell 210 is determined in 740 and a delay caused by the driver cell 210 is calculated in 742 as a function of the slope of the input signal and the total load capacitance $C_{total}$ of the net, the derivation of which is described above. Similarly the slope of an output signal generated by the driver cell 210 is calculated in 744 as a function of the slope of the input signal and the total load capacitance $C_{total}$ of the net. A delay caused by the wires 220, 222, 224 in the propagation of the output signal is calculated in 746 as a function of the slope of the output signal. Finally, the Effective Net Delay is calculated as a sum of the delay caused by the driver cell 210 plus the delay caused by the wires 220, 222, 224 in 748.

The delay caused by the wires 220, 222, 224 in the net 200 to the propagation of the output signal is calculated in 746, according to an embodiment of the present invention, with a software package based on an algorithm disclosed in Lawrence T. Pillage & Ronald A. Rohrer, *Asymptotic Waveform Evaluation for Timing Analysis*, 9 IEEE Transactions on Computer-Aided Design 352 (1990), hereinafter referred to as AWE. AWE employs a distributed lumped RC model for wires in the layout and analyses first, second, and third order effects in the calculation of the delay.

Figure 7D:
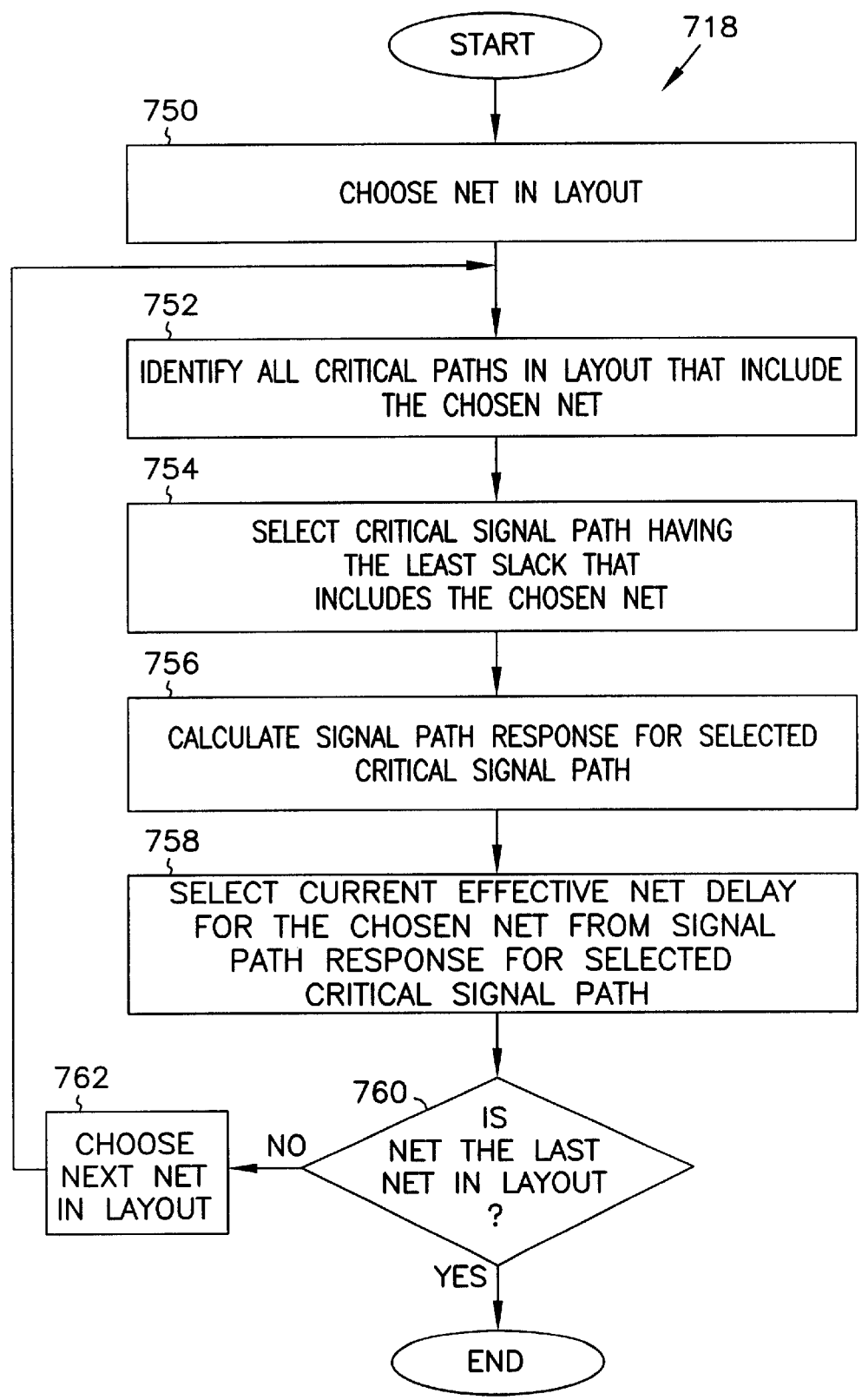

The selection of the Current Effective Net Delay for each net in the layout is now described in more detail with reference to FIG. 7D. A net in the layout is chosen in 750 and all critical signal paths in the layout that include the chosen net are identified in 752. The critical signal path with the least slack that includes the chosen net is selected in 754, where the critical signal path with the least slack is the critical signal path for which the actual delay exceeds the timing constraint by the greatest amount. A signal path response for the selected critical signal path is calculated in 756 according to the acts 722–732 described with reference to FIG. 7B. Then, in 758, the Current Effective Net Delay for the chosen net is selected from the signal path response calculated for the critical signal path with the least slack. If there are nets in the layout for which the Current Effective Net Delay has not been selected, as determined in 760, then the next net in the layout is chosen in 762 and the Current Effective Net Delay is selected for that net in 752–758. If the Current Effective Net Delay has been selected for all the nets in the layout as determined in 760 then the selection ends.

Figure 8:
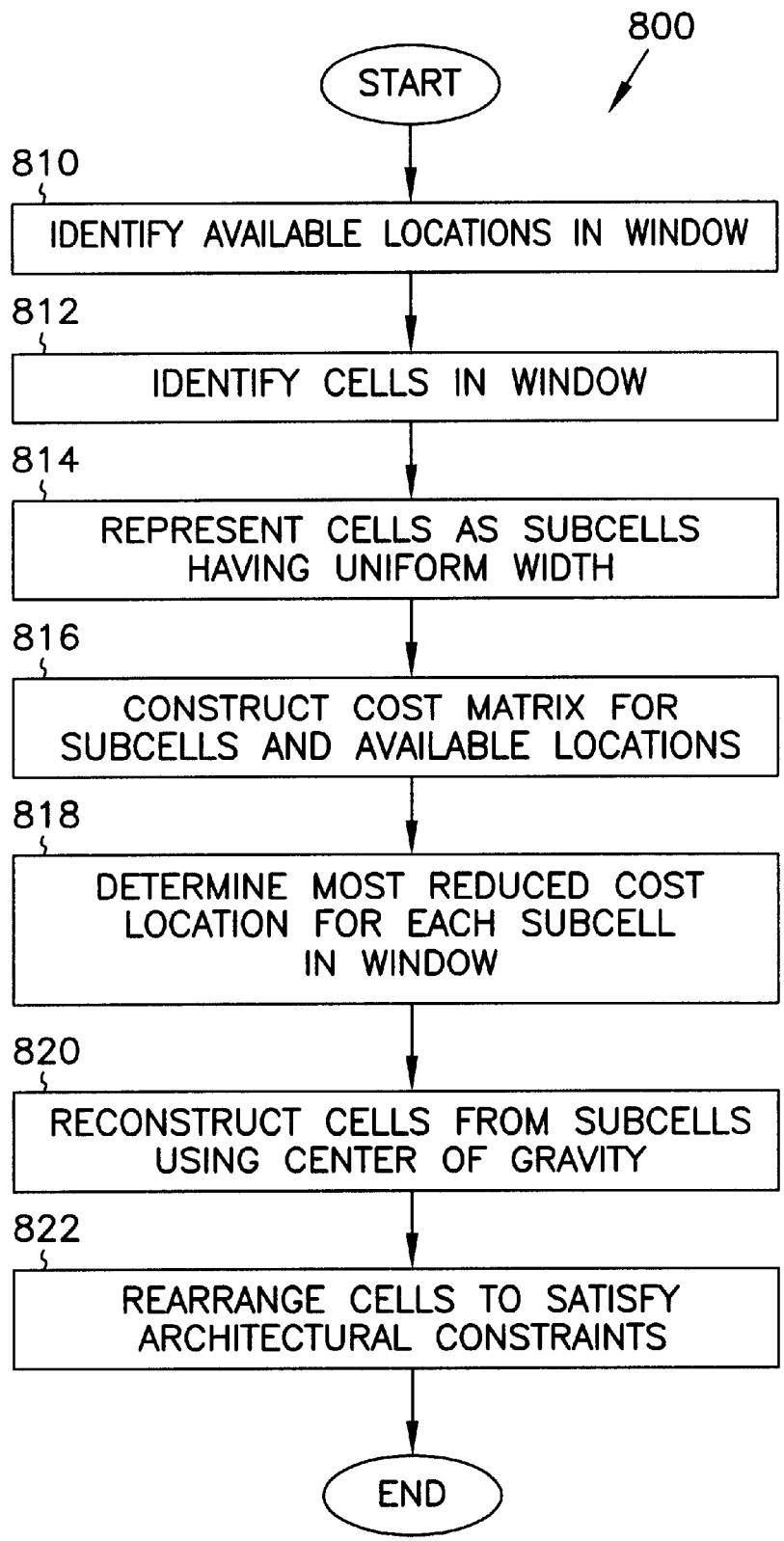
FIG. 8 is a flowchart of a method for rearranging a placement according to an embodiment of the present invention.

The rearrangement carried out in 518 of the placement method 500 will now be described with reference to a flowchart of a method 800 for rearranging a placement in a window. The method 800 is shown in FIG. 8 according to an embodiment of the present invention. The rearrangement includes determining a location for each cell in the placement by reducing a cost function and then legalizing the placement of the cells by eliminating overlapping cells. In 810 available locations for cells in the window are identified, and the existing cells in the window are identified in 812. In 814 the cells are divided into subcells having a uniform width, the width being selected based on the cell having the smallest width.

A cost matrix is then constructed for the subcells and the available locations in 816. The cost matrix is constructed by calculating a cost of placing each subcell in each available location according to a cost function. The number of intersections in the cost matrix is equal to a product of the number of cells and the number of available locations. The cost function is defined as:

$$\text{Total Cost}=\text{Wire Cost}+\text{Timing Cost} \quad (2)$$

where Wire Cost is equal to an estimated sum of the wire lengths of all nets in the layout when the subcell is placed in the location. The Wire Cost is estimated in 816 using the half perimeter box method, and is included to improve the density of the layout.

The Timing Cost is an estimated cost to the timing performance of the layout of placing the subcell in the location, and is included to improve the timing performance of the layout. The Timing Cost is estimated by extrapolation from the Current Effective Net Delay generated for the nets in the timing analysis in 514 of the placement method 500. The Timing Cost is based in part on a summation of an estimated delay caused by each net in the placement, called Estimated Effective Net Delay, which is determined for a net according to the following equations:

$$\text{Current Effective Net Delay}=\text{Current Wire Delay}+\text{Current Pin Delay} \quad (3)$$

where Current Wire Delay is the delay attributed to the wire length in the layout defined according to the capacitance of the wires and pins generated in 712 of the method 700:

$$\text{Current Wire Delay}=(C_{wire}/C_{total})*\text{Current Effective Net Delay} \quad (4)$$

where * indicates multiplication, and the Current Pin Delay is the delay attributed to the pins of the receiver cells connected to the net:

$$\text{Current Pin Delay}=(C_{pin}/C_{total})*\text{Current Effective Net Delay} \quad (5)$$

and Estimated Effective Net Delay is defined as $$\text{Estimated Effective Net Delay}=\text{Estimated Wire Delay}+\text{Estimated Pin Delay} \quad (6)$$

where the Estimated Wire Delay and Estimated Pin Delay are defined by relationships to Estimated Effective Net Delay that are the same as the corresponding relationships shown in equations (4) and (5).

The capacitance of the pins of receiver cells $C_{pin}$ connected to nets in the layout may be assumed to remain relatively stable when a subcell is moved to a new location. Therefore the Estimated Pin Delay is assumed to be equal to the Current Pin Delay in equation (7):

$$\text{Estimated Pin Delay}=\text{Current Pin Delay} \quad (7)$$

The Estimated Wire Delay may be estimated according to the change in the length of the wires in the layout due to the movement of the subcell. The change in the length of the wires may be represented as a difference between a Current Wire Length and an Estimated Wire Length. The Current Wire Length is retrieved from the model produced by the global router in 610 of FIG. 6. The Estimated Wire Length is determined using the half perimeter box method to estimate the length of the wires in the layout after the subcell has been moved to the new location. The Estimated Wire Delay is extrapolated from the capacitance of the wires and pins and the Current Effective Net Delay generated for each of the nets in the timing analysis of 514 according to equation (8):

$$\text{Estimated Wire Delay}=(\text{Estimated Wire Length}/\text{Current Wire Length})*(C_{wire}/C_{total})*\text{Current Effective Net Delay} \quad (8)$$

The above-listed equations (7) and (8) are combined with equation (6) to generate Estimated Effective Net Delay for each net in the placement. The wires in the placement are rearranged in each iteration of 518 in the placement method 500, and in each iteration the Estimated Wire Length is derived for the new wires. The half perimeter box method is used to rapidly estimate the Estimated Wire Length for each iteration. The calculation of the Estimated Wire Delay combines the accuracy of the Current Wire Length based on the detailed model of the wires generated by the global router and the rapidity of the calculation of the Estimated Wire Length in support of an accurate and efficient calculation of the Timing Cost that is described herein.

An Effective Net Delay Savings may be determined for each net representing a reduction in a delay caused by the net to the propagation of a signal after the placement of the subcell in the location. The Effective Net Delay Savings includes a consideration of factors other than the Estimated Effective Net Delay which will be explained below according to equation (9):

Effective Net Delay Savings=(Current Effective Net Delay–Estimated Effective Net Delay)*Net Criticality*Number of Critical Signal paths Containing Net (9)

The term Number of Critical Signal paths Containing Net indicates the importance of the net in the layout because the impact of a single net on the timing performance of the layout may increase in proportion to the number of critical signal paths to which it contributes a delay.

The term Net Criticality reflects the importance of the net to the timing performance of the layout. The net may be important for one of several reasons.

Figure 9:
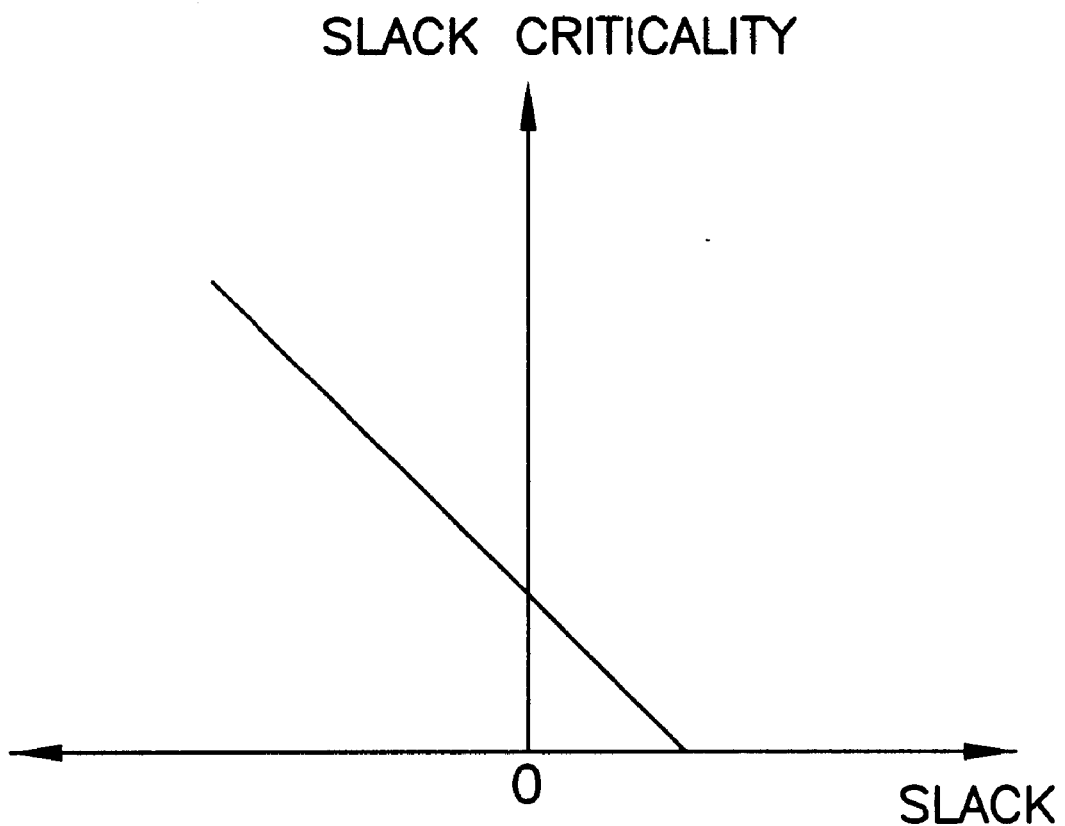
FIG. 9 is a plot of slack vs. slack criticality for a net according to an embodiment of the present invention.

One factor affecting Net Criticality is the slack of a net, which is similar to the slack of a critical signal path described above. The slack of a net is the difference between a timing constraint for the net and an actual delay caused by the net. The slack of a net is positive if the actual delay is less than the timing constraint, and the slack is negative if the actual delay is longer than the timing constraint. A net that has a very negative slack is more critical than a net that has a slightly negative or a positive slack, as shown in a plot of slack vs. Slack Criticality in FIG. 9 according to an embodiment of the present invention. A net with a very negative slack is more likely to cause the layout to violate the timing constraints. Slack Criticality is a quantified representation of the criticality of a net due to its slack. The sign of the slack of a net may be reversed in alternate embodiments of the present invention. The Slack Criticality may be calculated by selecting a critical signal path including the net for which the actual delay is longer than the timing constraint by the greatest amount, and calculating the Slack Criticality to be proportional to a difference between the actual delay and the timing constraint for the selected critical signal path.

Another factor affecting Net Criticality is the sensitivity of a net. The sensitivity of a net represents the impact of a change in the net on the timing performance of the layout, and is based on the capacitance of the wires and pins generated in 712 of the method 700. As discussed above, the load ratio for a net is $C_{total}/C_{max}$. The higher the load ratio $C_{total}/C_{max}$ the closer a signal on the net is to the maximum capacity of the net, and the more critical the net is. In addition, the ratio $C_{wire}/C_{total}$ indicates a portion of the load of a net that arises from the capacitance of the wiring in the net. The ratio $C_{pin}/C_{total}$ indicates a portion of the load of a net that arises from the capacitance of the pins of receiver cells connected to the net. The capacitance of the pins of receiver cells $C_{pin}$ may be assumed to remain relatively stable throughout the movement of subcells, and therefore, as mentioned above, improvements in timing performance may more likely result from the change in the wiring following a rearrangement of subcells. The higher the ratio $C_{wire}/C_{total}$ is for a net, the greater the impact of the net on the timing performance of the layout when subcells are moved. The sensitivity of a net is represented by a variable Wire Criticality which is equal to the ratio $C_{wire}/C_{pin}$ for the net. The higher the Wire Criticality $C_{wire}/C_{pin}$ is for the net, the greater the effect is of a change in the wiring of the net on the timing performance of the layout. The use of the sensitivity of a net in a calculation of the Effective Net Delay Savings guides the placement method 500 to realize substantial improvement in timing performance from the iterative placement of cells in a layout.

The Net Criticality is calculated as a product of the Slack Criticality and the Wire Criticality of the net. The Effective Net Delay Savings is then calculated according to equation (9) for each net in the layout. A Total Delay Savings may be determined for the entire layout resulting from the placement of the subcell in the location by summing the Effective Net Delay Savings for all the nets in the layout. The Total Delay Savings is a measure of the improvement of performance in timing as a result of the placement of the subcell in the location, including a consideration of a reduction in a delay in signal propagation, the sensitivity of the nets, and the location and number of the critical nets. The Timing Cost is the negative of the Total Delay Savings as shown in equation (10):

Timing Cost=–Total Delay Savings (10)

The Timing Cost is added to the Wire Cost in equation (2) to provide the Total Cost which is used to generate the data in the cost matrix in 816 of the method 800.

In 818 a reduced cost location for each subcell is determined by solving the cost matrix in a network flow solver. The subcells are placed in their reduced cost locations in the placement, and are combined to form the original cells in 820. Each cell is located according to a center of gravity of each of the contributing subcells as described below with reference to FIGS. 10A to 10H. Finally, the cells are legalized by rearranging them to satisfy architectural constraints in 822, or in other words to eliminate overlapping cells.

Figure 10A:
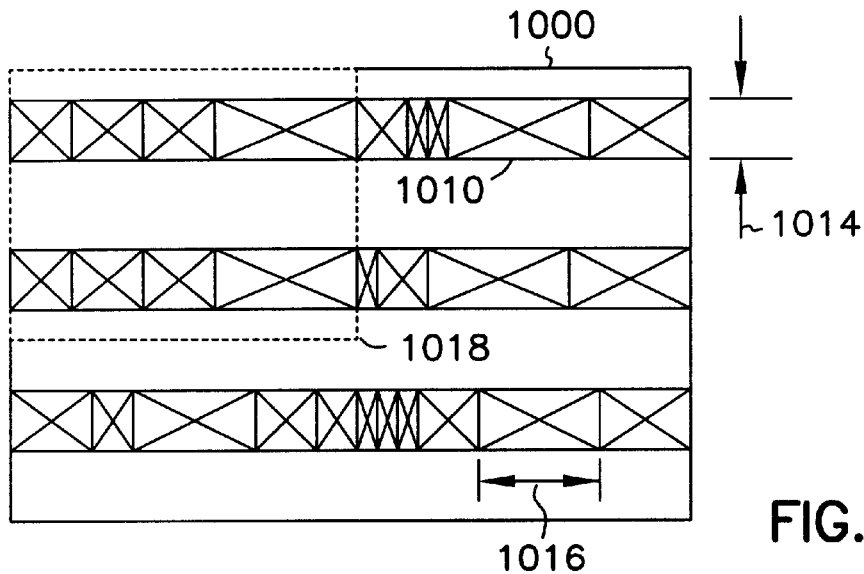
FIGS. 10A–10H are block diagrams of a rearrangement of a placement of cells in a window according to an embodiment of the present invention.
Figure 10B:
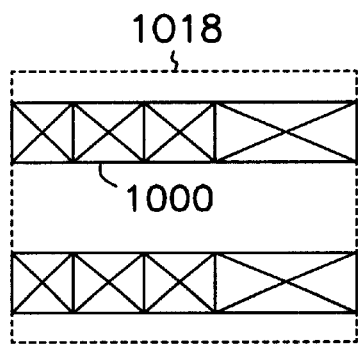
Figure 10C:
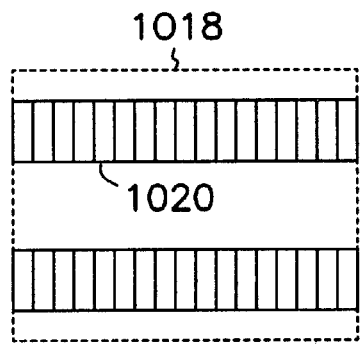
Figure 10D:
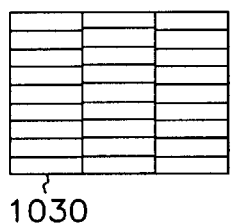
Figure 10D:
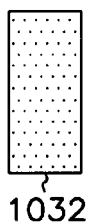
Figure 10D:
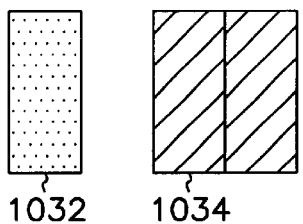
Figure 10E:
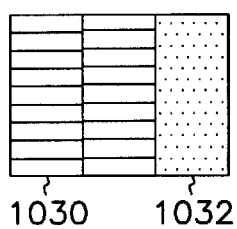
Figure 10E:
Figure 10E:
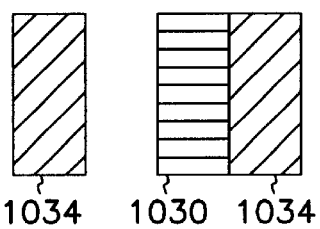
Figure 10F:
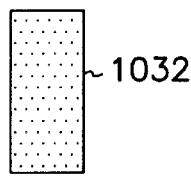
Figure 10F:
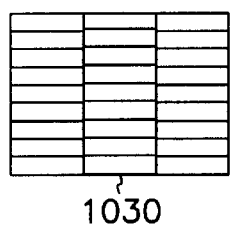
Figure 10F:
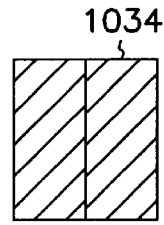
Figure 10G:
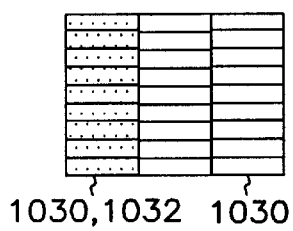
Figure 10G:
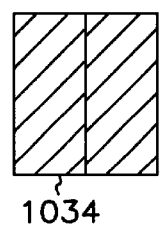
Figure 10H:
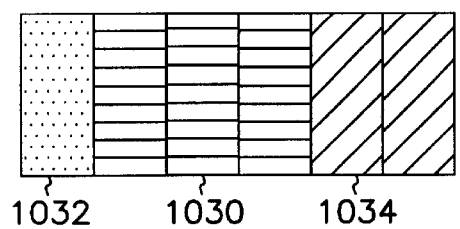

A block diagram of a rearrangement of cells in a window according to an embodiment of the present invention is shown in FIGS. 10A–10H. The block diagram shows how one iteration of the placement method 500 changes a placement of cells in a window. A rectangular placement 1000 of cells 1010 is shown in FIG. 10A. The cells 1010 are arranged in rows having a uniform height 1014 and varying widths 1016. A window 1018 including a portion of the placement 1000 is shown with a broken line in FIG. 10A and again in FIG. 10B. The cells 1010 in the window 1018 are divided into subcells 1020 having a uniform width as shown in FIG. 10C. The subcells 1020 are shown in FIG. 10D as subcells 1030, 1032, 1034 with different patterns of cross-hatching representing the cells from which they originated. The subcells 1030, 1032, 1034 are shown in FIG. 10E as being split up after the placement in the window has been improved in 818 of the method 800. The cells are then reconstructed using a center of gravity method as shown in an exploded view in FIG. 10F. According to the center of gravity method a center of gravity of each cell is located near a center of gravity of the constituent subcells in the improved placement. The resulting placement may leave some subcells overlapping, such as the subcells 1030, 1032 shown in FIG. 10G. The cells are rearranged in FIG. 10H to separate the overlapping subcells 1030, 1032, 1034.

With reference to FIGS. 5, 6, 7A–D, and 8, the methods described above with reference to flowcharts may be performed by a processor-based computer according to embodiments of the present invention. The methods to be performed may constitute computer programs for a physical design tool made up of computer-executable instructions. The methods shown above in FIGS. 5, 6, 7A–D, and 8, are implemented in a computer-readable medium comprising computer-readable instructions for causing a computer to perform the methods. Such a computer-readable medium may include software modules and computer programs. The computer-readable medium may be a floppy disk, a CD-ROM, or any other computer-readable medium known to those skilled in the art. The computer programs may comprise multiple modules or objects to perform the methods, or the functions of the methods. The type of computer programming languages used to write the code may vary from procedural code type languages to object oriented languages. Resulting files or objects need not have a one to one correspondence with the modules or method acts described depending on the desires of the programmer. Further, the methods and apparatus may comprise combinations of software, hardware and firmware as is well known to those skilled in the art. The description of the methods with reference to flowcharts enables one skilled in the art with the benefit of the present description to develop programs including instructions to carry out the methods on suitable computerized systems.

Figure 11:
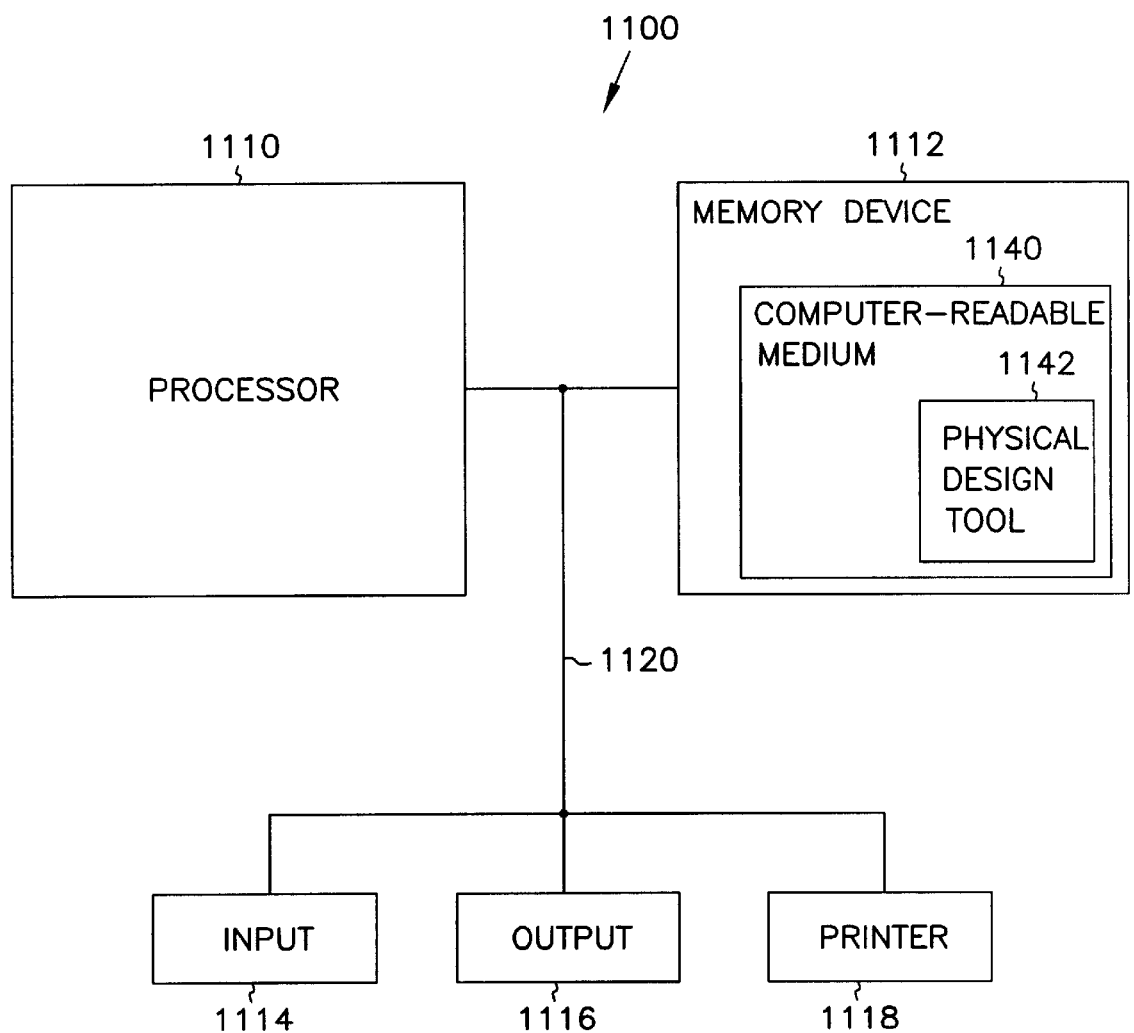
FIG. 11 is a block diagram of a computer system according to an embodiment of the present invention.

FIG. 11 is a block diagram of a computer system 1100 in conjunction with which embodiments of the present invention described above may be implemented. The system 1100 includes a processor 1110, a memory device 1112, and I/O devices such as an input device 1114, an output device 1116, and a printer 1118 which are coupled together by a bus 1120 for communicating information. The printer 118 may or may not be included in the system 1100. The memory device 112 includes a computer-readable medium 1140 such as a magnetic disk comprising computer-readable instructions. The computer-readable instructions may comprise a program for a physical design tool 1142 according to embodiments of the present invention. The memory device 1112 may also include a hard disk drive, a floppy disk drive, an optical disk drive, or a tape cartridge drive, and is coupled to the bus 1120 for storing data and instructions on the computer-readable medium 1140 communicated over the bus 1120. The output device 1116 may be a monitor such as a liquid crystal device, a cathode ray tube, or other display device suitable for creating graphic images and/or alphanumeric characters recognizable to a user. The input device 1114 may be a keyboard and may include alphanumeric and function keys coupled to the bus 1120 for communicating information and commands to the processor 1110. The printer 1118 is coupled to the bus 1120 to receive information from the processor 1110 and to reproduce the information in a form recognizable to a user. Other I/O devices that may be coupled to the bus 1120 include a modem or a pointing device such as a mouse. One skilled in the art with the benefit of the present description will recognize that more devices such as processors, memory devices, and I/O devices may be connected to the bus 1120. The computer system 1100 may also be configured in a different manner.

Although specific embodiments have been illustrated and described herein, it will be appreciated by those skilled in the art with the benefit of the present description that any arrangement which is calculated to achieve the same purpose may be substituted for the specific embodiments shown. The present invention is therefore limited only by the claims and equivalents thereof.

What is claimed is:

1. A method comprising:

placing cells of a circuit design in a placement of an integrated circuit;

analyzing the placement for timing performance comprising:

routing wires between the cells to complete a layout of the integrated circuit having a plurality of nets and signal paths, each signal path comprising a sequential ordering of one or more of the nets and cells occurring alternately, each net and each cell being included in one or more of the signal paths;

defining critical signal paths in the layout as being one or more of the signal paths having respective timing constraints; and for each net in the layout, calculating an effective delay caused by the net to a signal propagating through one of the critical signal paths having a slack that is less than a slack of other critical signal paths that also include the net comprising:

calculating a slack for each critical signal path in the layout including the net;

selecting one of the critical signal paths including the net and having a slack that is less than the slack of each other critical signal path that also includes the net;

calculating an effective delay to a propagation of an input signal through the selected critical signal path caused by the net in the selected critical signal path; and selecting the effective delay caused by the net to the propagation of the input signal through the selected critical signal path as a delay caused by the net in the layout; and rearranging the cells to improve a timing performance of the integrated circuit based on the analysis of the placement.

2. The method of claim 1 wherein calculating a slack for each critical signal path comprises:

calculating a signal path response for each critical signal path in the layout including the net; and calculating a slack for each critical signal path in the layout including the net as a difference between an actual delay caused by the critical signal path to a propagation of a signal and its timing constraint, the slack of the critical signal path being positive if the actual delay is less than the timing constraint, and the slack of the critical signal path being negative if the actual delay is longer than the timing constraint.

3. The method of claim 1 wherein calculating an effective delay further comprises:

defining the input signal with a slope to be received by the selected critical signal path; and for each net in the selected critical signal path:

calculating a delay caused by a driver cell receiving the input signal in the net as a function of the slope of the input signal and a total load capacitance of the net;

calculating a slope of an output signal generated by the driver cell as a function of the slope of the input signal and the total load capacitance of the net;

calculating a delay caused by wires in the net as a function of the slope of the output signal with a distributed lumped RC model of the wires;

calculating an effective delay caused by the net as a sum of the delay caused by the driver cell and a delay caused by the wires; and redefining the output signal as an input signal to a succeeding net in the selected critical signal path.

4. A method comprising:

placing cells of a circuit design in a placement of an integrated circuit;

routing wires between the cells to complete a layout of the integrated circuit having a plurality of nets and signal paths, each signal path comprising a sequential ordering of one or more of the nets and cells occurring alternately, each net and each cell being included in one or more of the signal paths; and analyzing the placement for timing performance comprising:

defining critical signal paths in the layout as being one or more of the signal paths having respective timing constraints;

calculating an actual delay caused by each critical signal path in the layout to a propagation of a signal through the critical signal path; and calculating a slack for each critical signal path in the layout as a difference between the actual delay caused by the critical signal path to a propagation of a signal and its timing constraint, the slack of the critical-signal path being positive if the actual delay is less than the timing constraint, and the slack of the critical signal path being negative if the actual delay is longer than the timing constraint; and for each cell in the placement identifying an improved location for the cell based on:

an estimated savings in delays caused by all of the nets in the layout to a signal propagating through the layout when the cell is placed in the improved location; and a net criticality of each net in the layout.

5. The method of claim 4, further comprising:

identifying the improved location for the cell based on a number of critical signal paths including the net, the estimated savings, and the net criticality; and calculating the net criticality of each net in the layout based on:

a slack criticality of the net; and a wire criticality of the net.

6. The method of claim 5, further comprising:

calculating the slack criticality of each net in the layout comprising:

selecting a critical signal path including the net for which the actual delay is longer than the timing constraint by the greatest amount; and calculating the slack criticality to be proportional to a difference between the actual delay and the timing constraint for the selected critical signal path; and calculating the wire criticality of each net in the layout as a ratio of a capacitance of wires in the net to a capacitance of pins in the net.

7. The method of claim 4, further comprising calculating the estimated savings for each cell in the placement comprising:

identifying available locations for the cell; and for each available location:

estimating a delay caused by a driver cell for each net in the layout when the cell is placed in the location;

estimating a delay caused by wires in each net in the layout when the cell is placed in the location;

estimating an effective delay caused by each net in the layout when the cell is placed in the location as a sum of the estimated delay caused by the wires and the estimated delay caused by the driver cell; and calculating the estimated savings for each net in the layout when the cell is placed in the location as a difference between the estimated effective delay and the actual delay for each net in the layout.

8. A computer-readable medium having computer-readable instructions for performing a method comprising:

placing cells of a circuit design in a placement of an integrated circuit; and analyzing the placement for timing performance comprising:

routing wires between the cells to complete a layout of the integrated circuit having a plurality of nets and signal paths, each signal path comprising a sequential ordering of one or more of the nets and cells occurring alternately, each net and each cell being included in one or more of the signal paths;

defining critical signal paths in the layout as being one or more of the signal paths having respective timing constraints; and for each net in the layout, calculating an effective delay caused by the net to a signal propagating through one of the critical signal paths having a slack that is less than a slack of other critical signal paths that also include the net comprising:

calculating a slack for each critical signal path in the layout including the net;

selecting one of the critical signal paths including the net and having a slack that is less than the slack of each other critical signal path that also includes the net;

calculating an effective delay to a propagation of an input signal through the selected critical signal path caused by the net in the selected critical signal path; and selecting the effective delay caused by the net to the propagation of the input signal through the selected critical signal path as a delay caused by the net in the layout; and rearranging the cells to improve a timing performance of the integrated circuit based on the analysis of the placement.

9. The computer-readable medium of claim 8 wherein calculating a slack for each critical signal path comprises:

calculating a signal path response for each critical signal path in the layout including the net; and calculating a slack for each critical signal path in the layout including the net as a difference between an actual delay caused by the critical signal path to a propagation of a signal and its timing constraint, the slack of the critical signal path being positive if the actual delay is less than the timing constraint, and the slack of the critical signal path being negative if the actual delay is longer than the timing constraint.

10. The computer-readable medium of claim 8 wherein calculating an effective delay further comprises:

defining the input signal with a slope to be received by the selected critical signal path; and for each net in the selected critical signal path:

calculating a delay caused by a driver cell receiving the input signal in the net as a function of the slope of the input signal and a total load capacitance of the net;

calculating a slope of an output signal generated by the driver cell as a function of the slope of the input signal and the total load capacitance of the net;

calculating a delay caused by wires in the net as a function of the slope of the output signal with a distributed lumped RC model of the wires;

calculating an effective delay caused by the net as a sum of the delay caused by the driver cell and a delay caused by the wires; and redefining the output signal as an input signal to a succeeding net in the selected critical signal path.

11. A computer-readable medium having computer-readable instructions for performing a method comprising:

placing cells of a circuit design in a placement of an integrated circuit;

routing wires between the cells to complete a layout of the integrated circuit having a plurality of nets and signal paths, each signal path comprising a sequential ordering of one or more of the nets and cells occurring alternately, each net and each cell being included in one or more of the signal paths;

analyzing the placement for timing performance comprising:

defining critical signal paths in the layout as being one or more of the signal paths having respective timing constraints;

calculating an actual delay caused by each critical signal path in the layout to a propagation of a signal through the critical signal path; and calculating a slack for each critical signal path in the layout as a difference between the actual delay caused by the critical signal path to a propagation of a signal and its timing constraint, the slack of the critical signal path-being positive if the actual delay is less than the timing constraint, and the slack of the critical signal path being negative if the actual delay is longer than the timing constraint; and for each cell in the placement identifying an improved location for the cell based on:

an estimated savings in delays caused by all of the nets in the layout to a signal propagating through the layout when the cell is placed in the improved location; and a net criticality of each net in the layout.

12. The computer-readable medium of claim 11, further comprising computer-readable instructions for:

identifying the improved location for the cell based on a number of critical signal paths including the net, the estimated savings, and the net criticality; and calculating the net criticality of each net in the layout based on:
 a slack criticality of the net; and
 a wire criticality of the net.

13. The computer-readable medium of claim 12, further comprising computer-readable instructions for:

calculating the slack criticality of each net in the layout comprising:

selecting a critical signal path including the net for which the actual delay is longer than the timing constraint by the greatest amount; and calculating the slack criticality to be proportional to a difference between the actual delay and the timing constraint for the selected critical signal path; and calculating the wire criticality of each net in the layout as a ratio of a capacitance of wires in the net to a capacitance of pins in the net.

14. The computer-readable medium of claim 11, further comprising computer-readable instructions for calculating the estimated savings for each cell in the placement comprising:

identifying available locations for the cell; and for each available location:

estimating a delay caused by a driver cell for each net in the layout when the cell is placed in the location;

estimating a delay caused by wires in each net in the layout when the cell is placed in the location;

estimating an effective delay caused by each net in the layout when the cell is placed in the location as a sum of the estimated delay caused by the wires and the estimated delay caused by the driver cell; and calculating the estimated savings for each net in the layout when the cell is placed in the location as a difference between the estimated effective delay and the actual delay for each net in the layout.

15. A method of analyzing a placement of cells of a circuit design for timing performance comprising:

routing wires between the cells to complete a layout of the integrated circuit having a plurality of nets and signal paths, each signal path comprising a sequential ordering of one or more of the nets and cells occurring alternately, each net and each cell being included in one or more of the signal paths;

defining critical signal paths in the layout as being one or more of the signal paths having respective timing constraints; and for each net in the layout, calculating an effective delay caused by the net to a signal propagating through one of the critical signal paths having a slack that is less than a slack of other critical signal paths that also include the net comprising:

calculating a slack for each critical signal path in the layout including the net;

selecting one of the critical signal paths including the net and having a slack that is less than the slack of each other critical signal path that also includes the net;

calculating an effective delay to a propagation of an input signal through the selected critical signal path caused by the net in the selected critical signal path; and selecting the effective delay caused by the net to the propagation of the input signal through the selected critical signal path as a delay caused by the net in the layout.

16. The method of claim 15 wherein calculating an effective delay further comprises:

defining the input signal with a slope to be received by the selected critical signal path; and for each net in the selected critical signal path:

calculating a delay caused by a driver cell receiving the input signal in the net as a function of the slope of the input signal and a total load capacitance of the net;

calculating a slope of an output signal generated by the driver cell as a function of the slope of the input signal and the total load capacitance of the net;

calculating a delay caused by wires in the net as a function of the slope of the output signal with a distributed lumped RC model of the wires;

calculating an effective delay caused by the net as a sum of the delay caused by the driver cell and a delay caused by the wires; and redefining the output signal as an input signal to a succeeding net in the selected critical signal path.

17. The method of claim 15 wherein calculating a slack for each critical signal path comprises:

calculating a signal path response for each critical signal path in the layout including the net; and calculating a slack for each critical signal path in the layout including the net as a difference between an actual delay caused by the critical signal path to a propagation of a signal and its timing constraint, the slack of the critical signal path being positive if the actual delay is less than the timing constraint, and the slack of the critical signal path being negative if the actual delay is longer than the timing constraint.

* * * * *

UNITED STATES PATENT AND TRADEMARK OFFICE
CERTIFICATE OF CORRECTION

PATENT NO. : 6,507,938 B1
DATED : January 14, 2003
INVENTOR(S) : Roy-Neogi et al.

It is certified that error appears in the above-identified patent and that said Letters Patent is hereby corrected as shown below:

<u>Title page,</u>
Item [74], delete "Kluth PA" and insert -- Kluth, P.A. --, therefor.

<u>Column 4,</u>
Line 67, delete "GORDIAN," and insert -- GORDIAN: --, therefor.

<u>Column 6,</u>
Line 15, after "$C_{pin}$" delete ",".

<u>Column 11,</u>
Line 28, delete "118" and insert -- 1118 --, therefor.
Line 29, delete "112" and insert -- 1112 --, therefor.

<u>Column 13,</u>
Line 17, delete "critical-signal" and insert -- critical signal --, therefor.

<u>Column 15,</u>
Line 23, delete "path-being" and insert -- path being --, therefor.

Signed and Sealed this

Seventeenth Day of June, 2003

JAMES E. ROGAN
*Director of the United States Patent and Trademark Office*